US010614941B2

United States Patent
Kusunoki et al.

(10) Patent No.: US 10,614,941 B2
(45) Date of Patent: Apr. 7, 2020

(54) PERSISTENT CURRENT SWITCH AND SUPERCONDUCTING COIL

(71) Applicant: HITACHI, LTD., Tokyo (JP)

(72) Inventors: Toshiaki Kusunoki, Tokyo (JP); Hideki Tanaka, Tokyo (JP); Motomune Kodama, Tokyo (JP); Hiroyuki Yamamoto, Tokyo (JP)

(73) Assignee: HITACHI, LTD., Tokyo (JP)

( * ) Notice: Subject to any disclaimer, the term of this patent is extended or adjusted under 35 U.S.C. 154(b) by 434 days.

(21) Appl. No.: 15/505,839

(22) PCT Filed: Mar. 27, 2015

(86) PCT No.: PCT/JP2015/059541
§ 371 (c)(1),
(2) Date: Feb. 22, 2017

(87) PCT Pub. No.: WO2016/042821
PCT Pub. Date: Mar. 24, 2016

(65) Prior Publication Data
US 2017/0278608 A1    Sep. 28, 2017

(30) Foreign Application Priority Data

Sep. 19, 2014   (JP) ................................. 2014-191033

(51) Int. Cl.
*H01F 6/06*          (2006.01)
*H01F 6/00*          (2006.01)
(52) U.S. Cl.
CPC .............. *H01F 6/06* (2013.01); *H01F 6/006* (2013.01); *Y10S 505/882* (2013.01)
(58) Field of Classification Search
None
See application file for complete search history.

(56) References Cited

U.S. PATENT DOCUMENTS 3,686,750 A * 8/1972 Woolcock .............. H01B 12/10
29/599
3,760,092 A * 9/1973 Woolcock .............. H01B 12/10
174/15.5

(Continued)

FOREIGN PATENT DOCUMENTS

JP    01-161806 A    6/1989
JP    09-148125 A    6/1997

(Continued)

OTHER PUBLICATIONS

Machine translation of JPH01161806, pp. 1-5, translated via Espacenet on Oct. 3, 2019 but published originally Jun. 1989. (Year: 1989).*

*Primary Examiner* — Colleen P Dunn
(74) *Attorney, Agent, or Firm* — Volpe and Koenig, P.C.

(57) ABSTRACT

Provided is a high-performance persistent current switch that is provided with a superconducting coil in which a decrease of a critical current or a critical magnetic field is suppressed. A means for solving the problem is as follows. A persistent current switch provided with a superconducting coil in a switch unit. A superconducting coil 5 includes a winding portion 53 which is formed using a superconductor thin film formed on an outer circumferential face of a base member 50. The winding portion 53 includes a first winding portion 51 and a second winding portion 52 which are formed in a double helical shape to be parallel to each other. A terminating end portion 51b of the first winding portion 51 and a starting end portion 52a of the second winding portion 52, which are adjacent to each other, are connected to each other.

9 Claims, 10 Drawing Sheets

(56) References Cited

U.S. PATENT DOCUMENTS

| | | | | |
|---|---|---|---|---|
| 3,763,552 A * | 10/1973 | Brown | ............... | H01L 39/00 29/599 |
| 4,101,731 A * | 7/1978 | Marancik | ............... | H01L 39/14 174/125.1 |
| 4,186,441 A * | 1/1980 | Baechtold | ............... | G11C 19/0858 327/527 |
| 4,270,264 A * | 6/1981 | Weisse | ............... | H01F 6/065 148/516 |
| 4,280,095 A * | 7/1981 | Hinton | ............... | G01R 33/0358 29/599 |
| 4,384,265 A * | 5/1983 | Shimamoto | ............... | H01F 6/06 174/125.1 |
| 4,808,954 A * | 2/1989 | Ito | ............... | H01F 5/02 174/125.1 |
| 5,917,393 A * | 6/1999 | Kupiszewski | ............... | H01F 6/06 174/125.1 |
| 8,112,134 B2 * | 2/2012 | Kramer | ............... | H01L 39/16 505/211 |
| 8,880,134 B2 * | 11/2014 | Husband | ............... | H01F 6/065 361/19 |
| 8,989,829 B1 * | 3/2015 | Jones, III | ............... | H01L 39/128 505/190 |
| 9,014,771 B1 * | 4/2015 | Jones, III | ............... | H01L 39/128 505/190 |
| 9,640,310 B2 * | 5/2017 | Hugill | ............... | H01F 6/06 |
| 10,192,681 B2 * | 1/2019 | Hugill | ............... | H01F 6/06 |
| 2009/0264294 A1 * | 10/2009 | Kramer | ............... | H01L 39/16 505/210 |
| 2010/0012353 A1 * | 1/2010 | Milshtein | ............... | H01L 31/02168 174/250 |
| 2015/0123760 A1 * | 5/2015 | Meinke | ............... | H01F 5/02 336/208 |

FOREIGN PATENT DOCUMENTS

| | | |
|---|---|---|
| JP | 10-107332 A | 4/1998 |
| JP | 2010-123621 A | 6/2010 |
| JP | 2012-195413 A | 10/2012 |

* cited by examiner

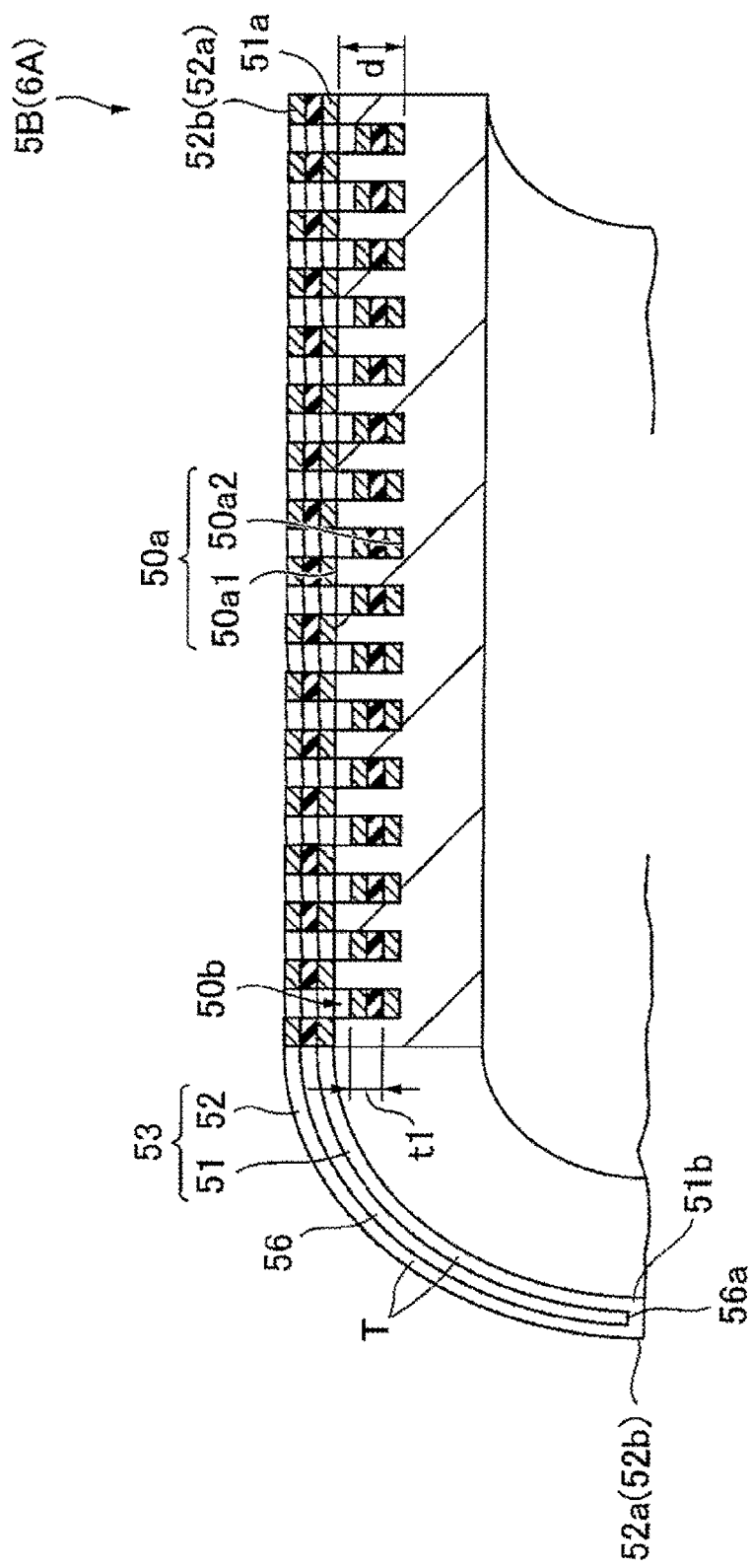

PERSISTENT CURRENT SWITCH AND SUPERCONDUCTING COIL

TECHNICAL FIELD

The present invention relates to a persistent current switch and a superconducting coil.

BACKGROUND ART

Superconductors are capable of expressing a superconducting phenomenon in which an electrical resistance becomes zero at an extremely low temperature and causing a large current to flow as compared to typical conductors such as a copper wire, and thus, superconducting coils obtained by processing a wire member as a superconductor in a coil shape can be used as a strong electromagnet. The superconducting coils have been used for, for example, a medical diagnostic device such as MRI (magnetic resonance imaging), a scientific measurement device such as NMR (nuclear magnetic resonance), a linear motor type magnetic levitation train, and the like.

As an example of the above-described superconducting coils, known is a coil that is provided with a winding portion in which a superconducting conductor, formed using a thin film-like superconducting wire obtained by stacking an intermediate layer, a superconducting layer, and a stabilized metal layer on one face of a metal substrate, is wound around a circumferential face of a cylindrical shape winding frame (see PTL 1 to be described later). In this superconducting coil, the superconducting conductor is co-wound with a stabilizing material formed using a metal tape, and the stabilizing material is arranged at least at an inner diameter side of the superconducting conductor. The superconducting conductor is wound such that a face of the stabilized metal layer and a face of the metal substrate become the inner diameter side and an outer shape side, respectively.

A persistent current switch including a non-inductive superconducting coil, for example, is used for opening and closing a persistent current circuit (see PTL 2 to be described later). Such a persistent current switch is formed using a conductor which can be switched in any direction between a superconducting state and a normal conducting state by setting an environment condition, for example. This conductor is turned into a switch-on state in the superconducting state as an electrical resistance becomes zero and current flows without being attenuated, and a switch-off state is practically realized when the conductor is switched to the normal conducting state and the electrical resistance increases.

CITATION LIST

Patent literature

PTL 1: JP 2012-195413 A
PTL 2: JP H10-107332 A

SUMMARY OF INVENTION

Technical Problem

In the superconducting coil described in PTL 1, the stabilizing material formed using the metal tape functions as a thermal capacitor when temperature of the superconducting conductor rises. Accordingly, it is considered that the temperature rise of the superconducting conductor caused when an excessive current flows to the superconducting coil is suppressed, and burning and deterioration of the superconducting conductor can be prevented, and thus, a winding structure which is highly reliable in terms of heat can be realized.

However, distortion of a winding becomes great in the superconducting coil described in PTL 1 due to a bending stress at the time of winding the superconducting conductor around the winding frame in the case of using a high-temperature superconductor such as a ceramic-like oxide high-temperature superconductor, which is relatively fragile, $MgB_2$, or an iron-based superconductor as the superconducting conductor. Thus, there is a risk of a decrease in a critical current, which is a current value at which the superconducting state is destroyed, or a critical magnetic field which is a value of a magnetic field from the outside at which the superconducting state is destroyed.

In addition, a non-inductive coil is generally used in the superconducting coil used in the persistent current switch in order to prevent generation of an unnecessary magnetic field as in the persistent current switch described in PTL 2. In the non-inductive coil, a curvature increases at a folded portion of the winding. Thus, there is a risk that the distortion of the winding of the superconducting coil is more likely to become greater, the critical current or the critical magnetic field decreases, and the performance of the persistent current switch deteriorates.

The present invention has been made in view of the above-described problems, and an object thereof is to provide a high-performance persistent current switch that is provided with a superconducting coil in which a decrease of a critical current or a critical magnetic field is suppressed.

Solution to Problem

In order to achieve the above-described object, a persistent current switch of the present invention is a persistent current switch provided with a superconducting coil in a switch unit. The superconducting coil includes a winding portion which is formed using a superconductor thin film formed on an outer circumferential face of a base member. The winding portion includes a first winding portion and a second winding portion which are formed in a double helical shape to be parallel to each other, and a terminating end portion of the first winding portion and a starting end portion of the second winding portion, which are adjacent to each other, are connected to each other.

Advantageous Effects of Invention

According to the persistent current switch of the present invention, the winding portion is formed on a surface of the base member, and thus, it is possible to provide the high-performance persistent current switch provided with the superconducting coil in which the generation of distortion in the winding portion is prevented, and the decrease of the critical current or the critical magnetic field is suppressed.

BRIEF DESCRIPTION OF DRAWINGS

FIG. 9 is a schematic cross-sectional view illustrating a cross-sectional structure of a superconducting coil according to a fourth embodiment of the present invention.

DESCRIPTION OF EMBODIMENTS

Hereinafter, embodiments of a persistent current switch and a superconducting coil of the present invention with reference to the drawings. Incidentally, the scale of each configuration is appropriately changed in order to make the configuration of the invention easily understandable in the following drawings.

First Embodiment

Figure 1:
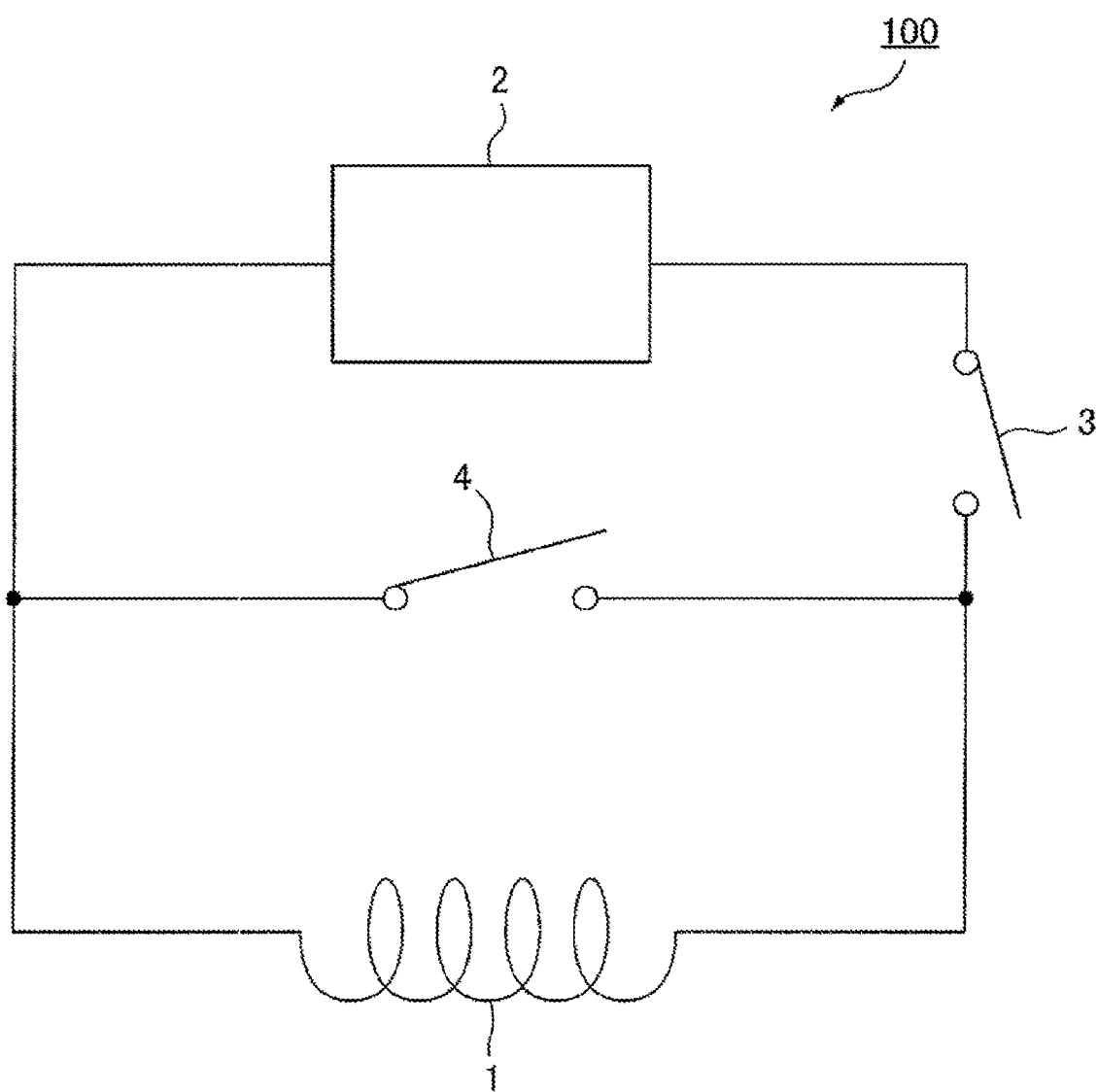
FIG. 1 is a schematic view illustrating a configuration of a general persistent current circuit.

FIG. 1 is a schematic view for describing a configuration of a general persistent current circuit 100. In general, the persistent current circuit 100 is provided with a superconducting coil 1 for outputting a magnetic field, an external power source 2, an external switch 3, and a persistent current switch 4.

The superconducting coil 1 for outputting a magnetic field is a coil manufactured using a superconductor, and can be used as a strong electromagnet by causing a large current according to a superconducting phenomenon to flow. The superconducting coil 1 for outputting a magnetic field is used for, for example, a medical diagnostic device such as MRI (magnetic resonance imaging), a scientific measurement device such as NMR (nuclear magnetic resonance), a linear motor type magnetic levitation train, and the like, and is used to output a large magnetic field.

The superconducting coil 1 for outputting a magnetic field is manufactured using a wire member of a so-called metal-based low-temperature superconductive member, for example, an NbTi alloy with a critical temperature of 9.8 K, an $Nb_3Sb$ intermetallic compound with a critical temperature of 18.2 K, and the like, and is used after being dipped in a liquid helium with a boiling point of 4.2 K, for example. In addition, the superconducting coil 1 for outputting a magnetic field can be manufactured using a high-temperature superconducting material which has been developed recently, and a wire member thereof.

Examples of the high-temperature superconducting material can include RE-based (RE is an rare-earth element and a representative example is $YBa_2Cu_3O_7$) or Bi-based (representative examples are $Bi_2Sr_2CaCu_2O_7$ and $Bi_2Sr_2Ca_2Cu_3O_{10}$) oxide high-temperature superconductors with a critical temperature exceeding a liquid nitrogen temperature of 77 K, metal-based $MgB_2$ with a critical temperature of 39 K, and further, an iron-based superconductor (such as LaFeAsO) with a critical temperature of about 50 K.

When the superconducting coil 1 is manufactured using the above-described high-temperature superconductor, it is possible to cause the coil to operate at a relatively high temperature of about 10 K to 20 K, for example, using a refrigerator technology, which can be used at low cost, without requiring the liquid helium which is relatively expensive.

The external power source 2 supplies power to the superconducting coil 1 for outputting a magnetic field via the external switch 3. The external switch 3 causes current from the external power source 2 to flow to the superconducting coil 1 for outputting a magnetic field in an on-state in which the switch is closed, and cuts off the current between the external power source 2 and the superconducting coil 1 for outputting a magnetic field in an off-state in which the switch is opened.

The persistent current switch 4 is provided with a coil-shaped winding portion formed using a superconductor as will be described later. The persistent current switch 4 is a thermal-type or a magnetic field-type persistent current switch, and is configured to be capable of controlling temperature of the winding portion or an external magnetic field (the magnetic field type) astride a critical temperature or a critical magnetic field of the winding portion. The persistent current switch 4 performs switching of a persistent current by switching a switch-on state in which the winding portion is in a superconducting state and a switch-off state in which superconducting state is destroyed and the winding portion is in a normal conducting state by controlling the temperature of the winding portion or the external magnetic field.

In the case of switching the persistent current circuit 100 to a persistent current mode, first, the external switch 3 is turned on to energize the superconducting coil 1 for generating a magnetic field. When the external switch 3 is turned off and the persistent current switch 4 is turned on after energizing the superconducting coil 1 for generating a magnetic field, a superconducting closed circuit is formed, and the persistent current circuit 100 is switched to the persistent current mode. In the thermal-type persistent current switch 4, the winding portion is formed in a coil shape together with a high-temperature control heater. On the other hand, the magnetic field-type persistent current switch 4 is configured using a superconducting coil for switch, a superconducting coil for generation of a control magnetic field and the like as will be described later in detail.

Figure 2:
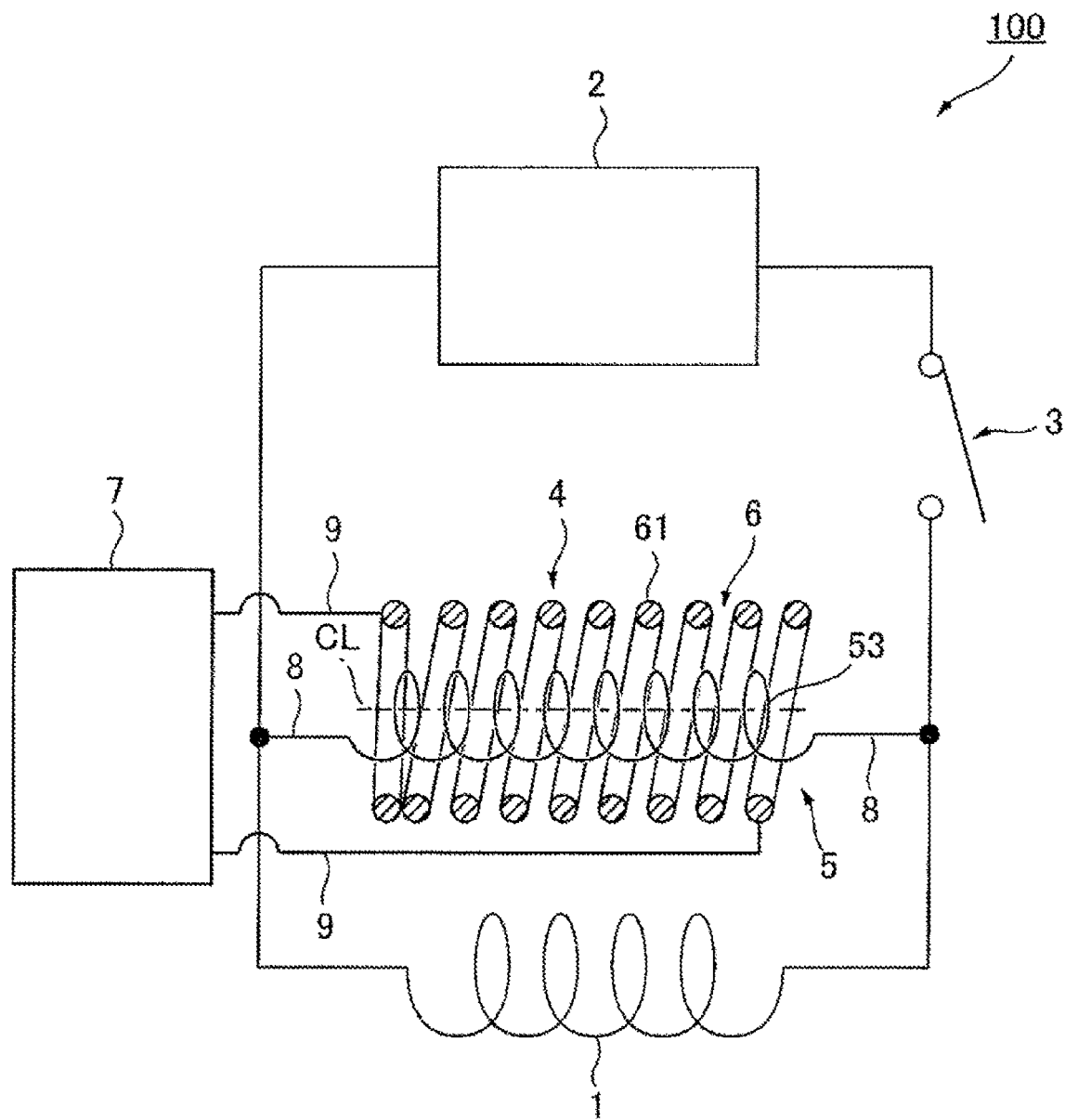
FIG. 2 is a schematic view a persistent current circuit which is provided with a persistent current switch according to a first embodiment of the present invention.

FIG. 2 is a schematic view of the persistent current circuit 100 which is provided with the magnetic field-type persistent current switch 4 according to a first embodiment of the present invention.

The persistent current circuit 100 according to the present embodiment illustrated in FIG. 2 is provided with the magnetic field-type persistent current switch 4 as the persistent current switch 4 illustrated in FIG. 1. The other configuration of the persistent current circuit 100 is the same as the configuration of the persistent current circuit 100 illustrated in FIG. 1, and thus, the same parts will be denoted by the same reference signs, and the description thereof will be omitted.

The persistent current switch 4 of the present embodiment is provided with a superconducting coil 5 for switch, a superconducting coil 6 for control which is configured to generate a control magnetic field to control the superconducting coil 5 for switch, and a control power source 7 which supplies current to the superconducting coil 6 for control. The superconducting coil 5 for switch and the superconducting coil 6 for control include, for example, winding portions 53 and 61 each of which is formed using a helical superconductor. The winding portion 53 of the superconducting coil 5 for switch is arranged at an inner side of the winding portion 61 of the superconducting coil 6 for control to be coaxial with a central axis CL of the winding portion 61 of the superconducting coil 6 for control.

The superconducting coil 5 for switch is connected to the persistent current circuit 100 via a lead wire 8 formed using a superconductor, and the superconducting coil 6 for control is connected to the control power source 7 via a lead wire 9 formed using a superconductor. Examples of the superconductor forming the winding portion 53 of the superconducting coil 5 for switch, the winding portion 61 of the superconducting coil 6 for control, and the lead wires 8 and 9 can include the above-described high-temperature superconducting material in addition to the above-described metal-based low-temperature superconductive member.

The persistent current switch 4 of the present embodiment switches the on-state and the off-state by causing the current to flow to the superconducting coil 6 for control via the control power source 7 and generating a magnetic field or cutting off the current flowing to the superconducting coil 6 for control and extinguishing the magnetic field. To be more specific, when the current flows to the superconducting coil 6 for control and the magnetic field is generated, the superconducting state of the superconducting coil 5 for switch is destroyed, and the superconducting coil 5 for switch is turned into the normal conducting state, and the persistent current switch 4 is turned into the off-state. In addition, when the current flowing to the superconducting coil 6 for control is cut off, and the magnetic field is extinguished, the superconducting state of the superconducting coil 5 for switch is restored, and the persistent current switch 4 is turned into the on-state.

Figure 3A:
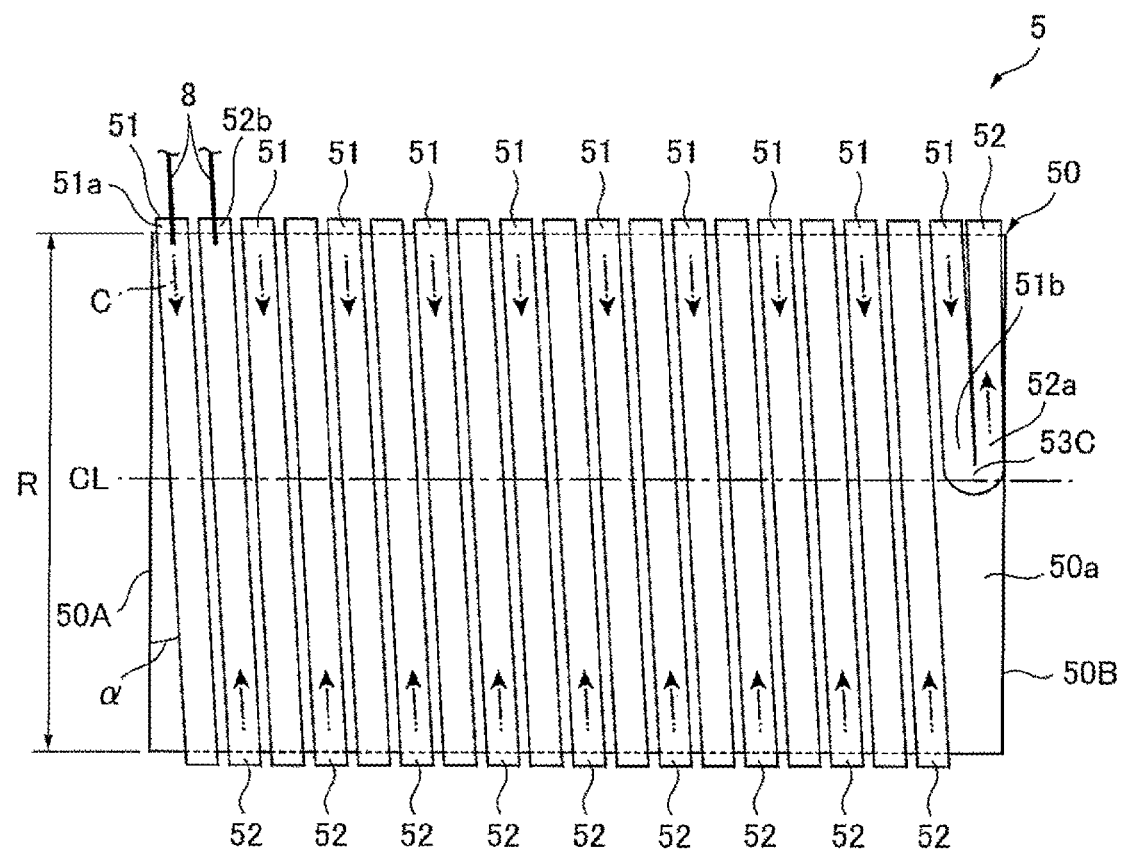
FIG. 3A is a schematic front view illustrating a superconducting coil illustrated in FIG. 2.
Figure 3B:
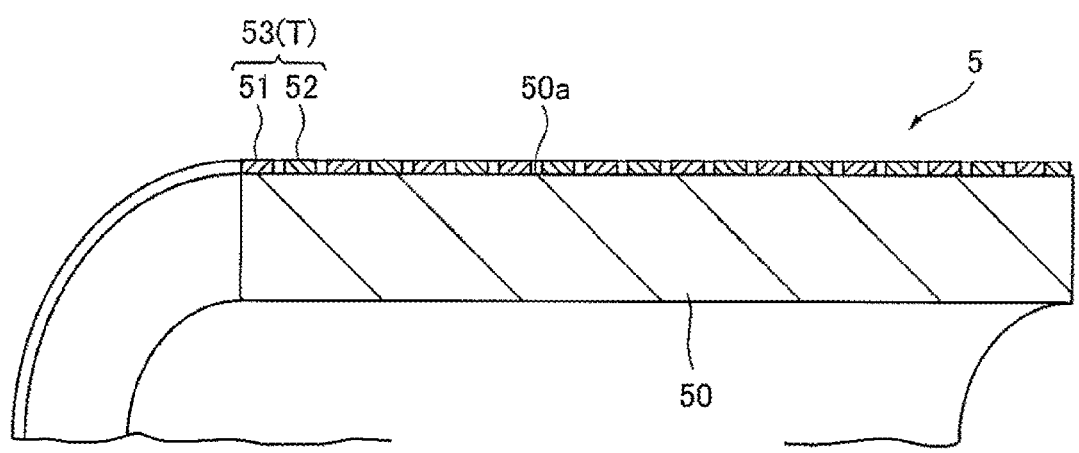
FIG. 3B is a schematic cross-sectional view a cross-sectional structure of the superconducting coil illustrated in FIG. 3A.

FIG. 3A is a schematic front view of the superconducting coil 5 for switch of the present embodiment provided in the persistent current switch 4 illustrated in FIG. 2. FIG. 3B is a schematic cross-sectional view illustrating a cross-sectional structure of a part of the superconducting coil 5 which is obtained by cutting the superconducting coil 5 illustrated in FIG. 3A along a plane perpendicular to the paper plane along the central axis CL and a plane parallel to the paper plane along the central axis CL.

The superconducting coil 5 for switch of the present embodiment includes a cylindrical base member 50 and the winding portion 53 formed using a superconductor thin film T deposited on an outer circumferential face 50a of a base member 50. Examples of the base member 50 serving as a bobbin of the superconducting coil 5 can include a material, which is manufactured using metal having a favorable thermal conductivity and has a cylinder surface subjected to insulation processing, a machinable ceramic having a favorable thermal conductivity, and the like.

To be more specific, examples of the base member 50 of the superconducting coil 5 can include a member, which is obtained by bonding an insulating tape such as a polyimide film to a cylinder surface of copper such as JIS alloy number C1020 having an excellent thermal conductivity or an aluminum alloy such as JIS alloy number A5052, a member, which is obtained by forming a nonporous anodic oxide film on a surface of an aluminum alloy such as JIS alloy number A5052 and insulating the film, and a cylindrical ceramic manufactured using aluminum nitride or the like.

The winding portion 53 is manufactured by, for example, forming the above-described metal-based low-temperature superconductive member or the above-described the high-temperature superconducting material on the outer circumferential face 50a of the base member 50. The winding portion 53 includes a first winding portion 51 and a second winding portion 52 which are formed in a double helical shape to be parallel to each other. The first winding portion 51 and the second winding portion 52, each of which is formed like a long strip using a superconductor thin film T, are arranged such that a starting end portion 51a of the first winding portion 51 and a terminating end portion 52b of the second winding portion 52 are adjacent to each other with an interval at one end 50A of the cylindrical base member 50 in the central axis CL direction. Each of the starting end portion 51a of the first winding portion 51 and the terminating end portion 52b of the second winding portion 52 is connected to the lead wire 8 formed using the superconductor.

Incidentally, the starting end portions 51a and 52a mean upstream end portions in a flowing direction of a current C, and the terminating end portions 51b and 52b mean downstream end portions in the flowing direction of the current C in the first winding portion 51 and the second winding portion 52.

As illustrated in FIG. 3A, the first winding portion 51 and the second winding portion 52 extend along a circumferential direction of the outer circumferential face 50a of the base member 50 to be parallel to each other in the state of being inclined with respect to a diameter R direction of the base member 50 at a predetermined angle α when seen from a direction perpendicular to the central axis CL of the cylindrical base member 50. Accordingly, the first winding portion 51 and the second winding portion 52 are alternately arranged from the one end 50A to the other end 50B of the base member 50 in the central axis CL direction, and are formed in the double helical shape which are parallel along the circumferential direction of the outer circumferential face 50a of the base member 50.

Each of the starting end portion 51a of the first winding portion 51 and the terminating end portion 52b of the second winding portion 52, which are adjacent to each other, is connected to the lead wire 8 at the one end 50A of the base member 50 in the central axis CL direction. The terminating end portion 51b of the first winding portion 51 and the starting end portion 52a of the second winding portion 52, which are adjacent to each other, are connected to each other on the outer circumferential face 50a of the base member 50 at the other end 50B on the opposite side of the one end 50A of the base member 50 in the central axis CL direction. Accordingly, a direction of a magnetic field generating in the first winding portion 51 serving as a forward path of the current C and a direction of a magnetic field generating in the second winding portion 52 serving as a backward path of the current C are reverse to each other when the current C flows to the winding portion 53, and the magnetic fields cancel out each other. That is, the superconducting coil 5 is a non-inductive superconducting coil which is provided with the non-inductive winding portion 53.

The winding portion 53 is bent at an extremely large curvature similarly to a width of the first winding portion 51 and the second winding portion 52 at a connection portion 53C between the terminating end portion 51b of the first winding portion 51 and the starting end portion 52a of the second winding portion 52, and takes a U-turn to be inverted in the reverse direction. Hereinafter, a description will be given regarding a method of manufacturing the superconducting coil 5 for switch of the present embodiment provided with the winding portion 53.

Figure 4:
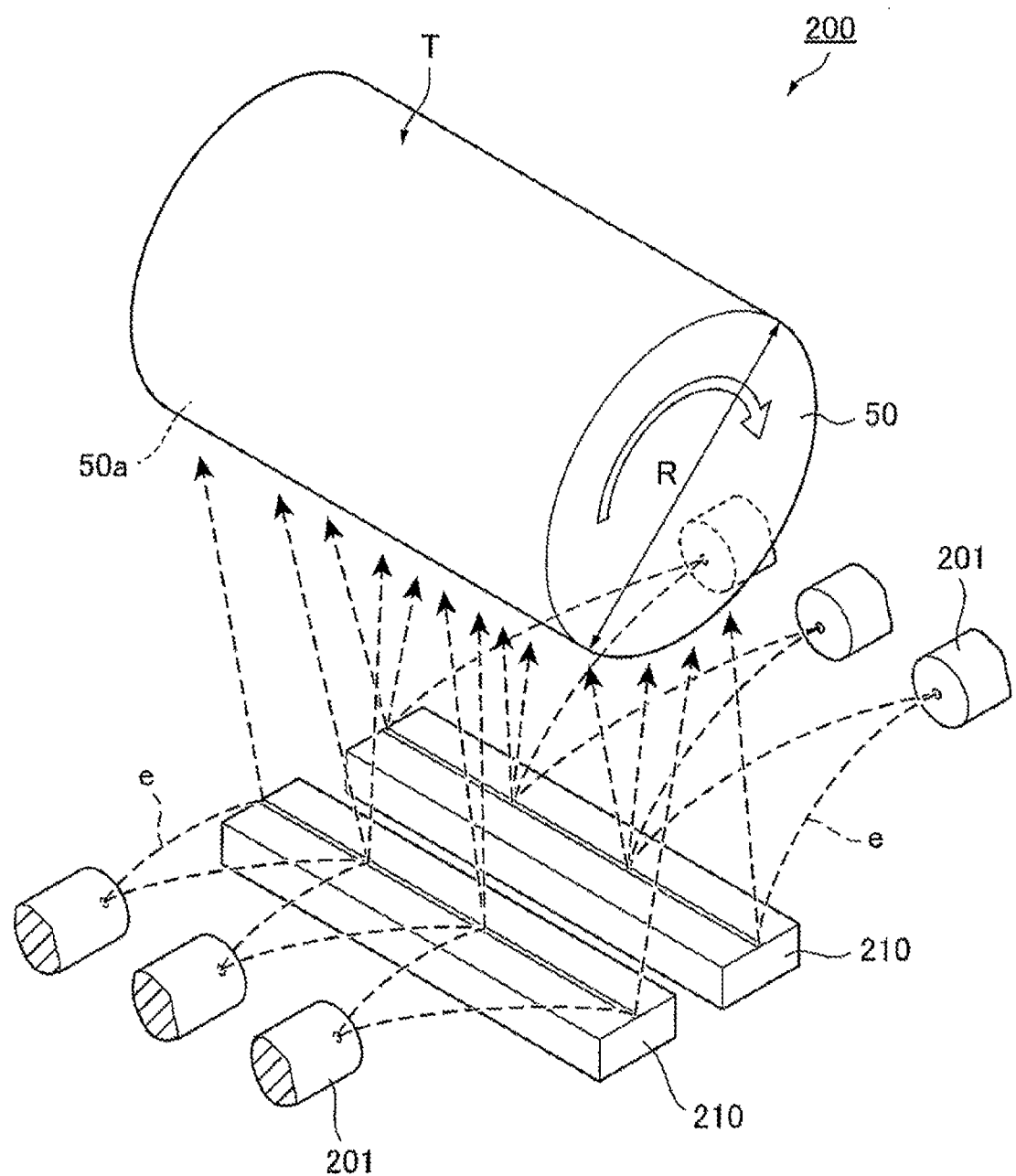
FIG. 4 is a schematic view of a film formation apparatus.
Figure 5A:
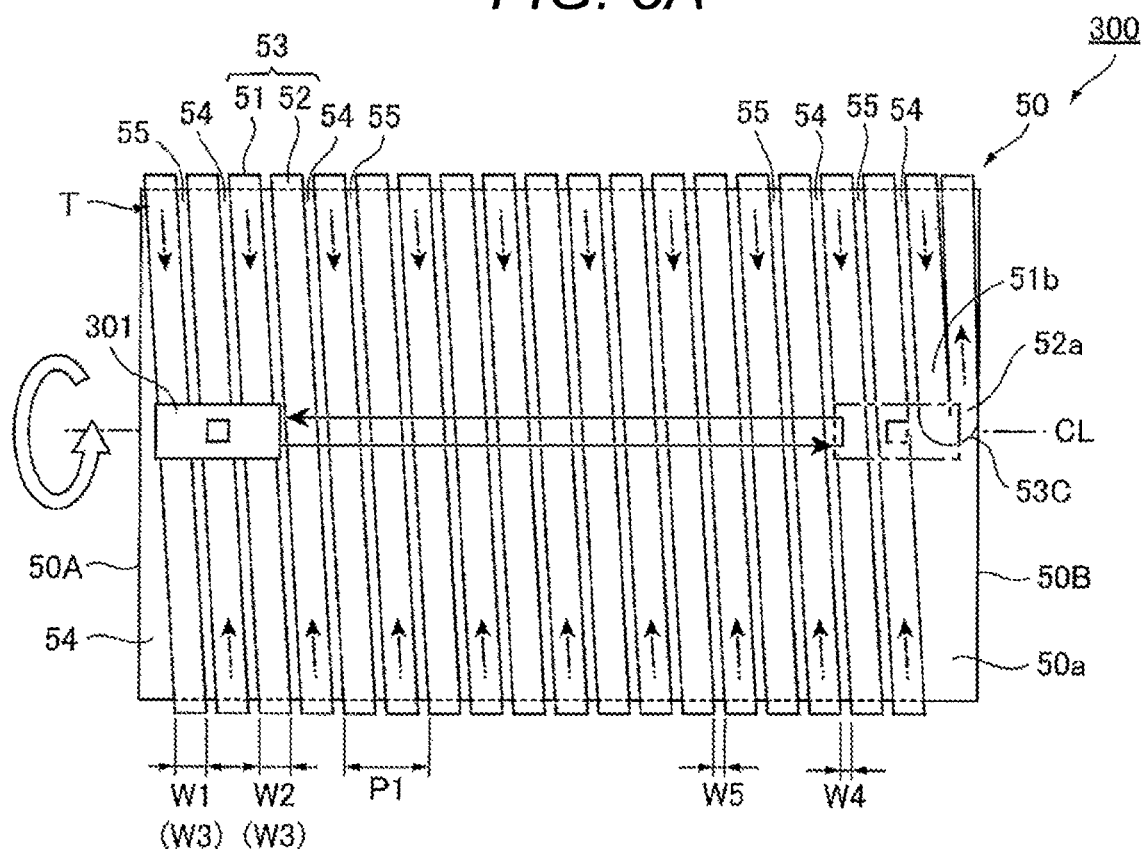
FIG. 5A is a schematic front view of the thin film processing apparatus.
Figure 5B:
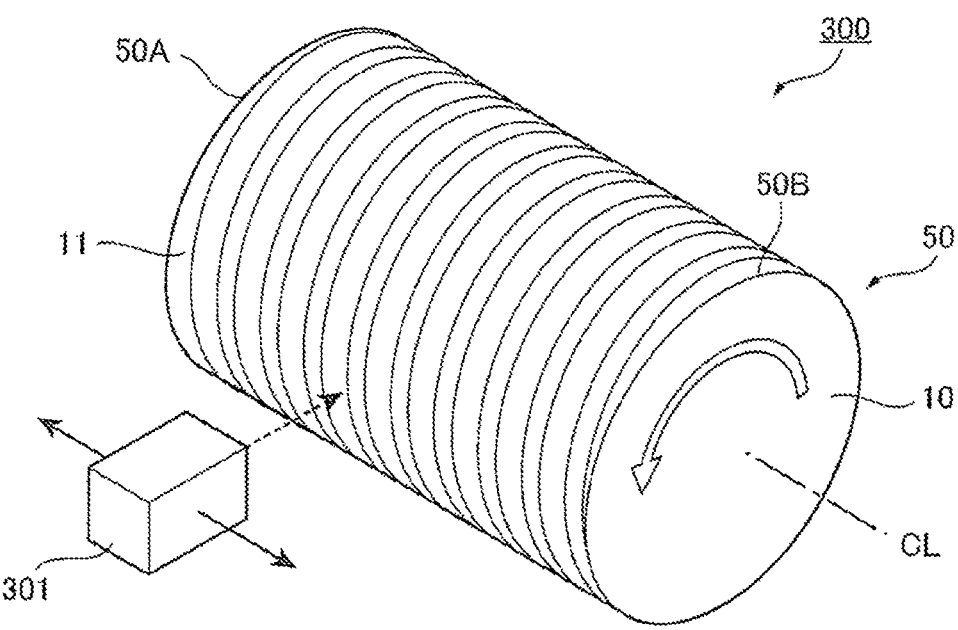
FIG. 5B is a schematic perspective view of the thin film processing apparatus illustrated in FIG. 5A.

FIG. 4 is a schematic view of a film formation apparatus 200 for describing a thin film forming step of forming the superconductor thin film T on the outer circumferential face 50a of the cylindrical base member 50. FIG. 5A is a schematic front view of a thin film processing apparatus 300 for describing a winding portion forming step of processing the superconductor thin film T formed in the thin film forming step into the helical winding portion 53. FIG. 5B is a schematic perspective view of the thin film processing apparatus 300 illustrated in FIG. 5A.

The method of manufacturing the superconducting coil 5 for switch of the present embodiment includes the thin film forming step of forming the superconductor thin film T, formed using the superconductor, on the outer circumferential face 50a of the base member 50 and the winding portion forming step of processing the superconductor thin film T formed in the thin film forming step into the helical winding portion 53.

The superconductor thin film T is formed on the outer circumferential face 50a of the cylindrical base member 50 described above, for example, by the film formation apparatus 200 in the thin film forming step. The diameter R of the cylindrical base member 50 can be set to, for example, about several cm to several tens of cm. The film formation apparatus 200 houses the base member 50 in a film formation chamber, injects an electron beam e using an electron gun 201, causes the electron beam e to be directed to an evaporation source 210 as a target using a magnetic field formed inside the film formation chamber, and heats the evaporation source 210 using the electron beam e.

In addition, the film formation apparatus 200 holds the cylindrical base member 50 on the evaporation source 210, and heats the base member 50 to a temperature of about, for example, 220° C. to 300° C. using a heater (not illustrated), which is installed inside of the base member 50 or on the opposite side of the evaporation source 210 to be rotated. Accordingly, the film formation apparatus 200 performs deposition of a material forming the evaporation source 210 directly on the outer circumferential face 50a of the base member 50, and forms the superconductor thin film T formed using the superconductor on the outer circumferential face 50a. A film thickness of the superconductor thin film T formed on the outer circumferential face 50a can be set to about, for example, several μm to several tens of μm, or several tens of μm to several hundreds of μm.

When the superconductor thin film T made of $MgB_2$, for example, which is the high-temperature superconductor, is formed on the outer circumferential face 50a of the base member 50 in the thin film forming step, Mg and B are co-deposited on the outer circumferential face 50a of the base member 50 using two evaporation sources including the evaporation source 210 made of Mg and the evaporation source 210 made of B. Accordingly, it is possible to directly form the superconductor thin film made of $MgB_2$, which is the high-temperature superconductor, on the outer circumferential face 50a of the base member 50. Incidentally, a stabilization layer such as Cu and Al is stacked on a surface of the superconductor thin film T formed on the outer circumferential face 50a of the base member 50 (not illustrated).

The method of forming the superconductor thin film T on the outer circumferential face 50a of the base member 50 in the thin film forming step is not limited to an electron beam vapor deposition method described in the present embodiment, and a known film forming method such as a sputtering method and a pulsed laser vapor deposition method can be used. In addition, the superconductor to be formed on the outer circumferential face 50a of the base member 50 is not limited to $MgB_2$, and it is possible to form any one of the RE-based, the Bi-based, and the copper-based high-temperature superconductors. In addition, the superconductor is not limited to the high-temperature superconductor, and the metal-based low-temperature superconductive member described may be formed.

In the winding portion forming step, it is possible to process the superconductor thin film T, formed in the thin film forming step using, for example, a laser processing device as the thin film processing apparatus 300, into the helical winding portion 53 using a laser cutting method. Examples of laser to be used in the laser cutting method can include an UV pulsed laser having a wavelength of about 355 nm. Accordingly, it is possible to form the winding portion 53, for example, having a width W3 of about 20 μm. Incidentally, the thin film processing apparatus 300 is not limited to the laser processing device, and, for example, a scriber device can be used to form the winding portion 53 in the same manner as the laser processing using a cutting blade.

When the winding portion 53 having the non-inductive double helix structure is formed using the laser cutting method, the laser unit 301 is moved from the one end 50A to the other end 50B of the base member 50 in the central axis CL direction along the central axis CL of the base member 50 while rotating the base member 50 about the central axis CL as illustrated in FIG. 5A and FIG. 5B. Accordingly, a helical first groove 54 is formed in the superconductor thin film T formed on the outer circumferential face 50a of the base member 50 from the one end 50A to the other end 50B of the base member 50.

A pitch P1 of the first groove 54 is determined, for example, based on a width W1 of the first winding portion 51, a width W2 of the second winding portion 52, and a width W5 of a second groove 55 between the first winding portion 51 and the first winding portion 51 which are formed in the subsequent steps. To be more specific, the pitch P1 of the first groove 54 can be set to, for example, a sum of a width W4 of the first groove 54, the width W1 of the first winding portion 51, the width W5 of the second groove 55, and the width W2 of the second winding portion 52.

The connection portion 53C, which connects the terminating end portion 51b of the first winding portion 51 and the starting end portion 52a of the second winding portion 52, is formed in the superconductor thin film T on the outer circumferential face 50a of the base member 50 after forming the first groove 54 in the superconductor thin film T on the outer circumferential face 50a of the base member 50. The formation of the connection portion 53C is performed by appropriately adjusting movement of the laser unit 301 and injection of laser, rotation of the base member 50 and the like. Thereafter, the laser unit 301 is moved from the other end 50B to the one end 50A of the base member 50 in the central axis CL direction along the central axis CL of the base member 50 while rotating the base member 50 in a reverse direction of the rotation direction thereof at the time of forming the first groove 54. Accordingly, the second groove 55, which straddles the connection portion 53C and divides the first winding portion 51 and the second winding portion 52, is formed. The width W5 of the second groove 55 can be set to be equal to the width W4 of the first groove 54. In the above-described manner, the non-inductive winding portion 53 provided with the first winding portion 51 and the second winding portion 52 formed in a double helical shape to be parallel to each other.

In addition, the winding portion 61 of the superconducting coil 6 for control to be used for the persistent current switch 4 of the present embodiment can be formed using a method which is the same as the method of forming the first winding portion 51 and the first groove 54 on the outer circumferential face 50a of the base member 50 of the superconducting coil 5 for switch, for example. In this case, it is possible to use a cylindrical base member which is the same as the base member 50 of the superconducting coil 5 as the base member of the superconducting coil 6 for control. In this case, a member provided with a hollow portion in which the superconducting coil 5 for switch can be coaxially housed is used as the base member of the superconducting coil 6 for control.

Next, a description will be given regarding action of persistent current switch 4 and the superconducting coil 5 for switch of the present embodiment.

When a wire member made of a superconductor is wound around a base member to form a winding portion in a conventional superconducting coil in a case in which a curvature radius of the winding portion is reduced as the superconducting coil is reduced in size or in the case of using a high-temperature superconductor which is relatively fragile as a material of the winding portion, distortion of the winding portion becomes great. In particular, a curvature at a folded portion of the wire member to form the winding portion becomes great in a non-inductive coil, and the distortion of the winding portion is likely to become great. When the distortion of the winding portion becomes great, a critical current or a critical magnetic field of the superconducting coil decreases, and there is a risk that performance of a persistent current switch deteriorates.

On the other hand, the persistent current switch 4 of the present embodiment is provided with the superconducting coil 5, and the superconducting coil 5 includes the winding portion 53 formed using the superconductor thin film T formed on the outer circumferential face 50a of the base member 50. Thus, there is no step of bending the winding portion 53 along the curvature of the base member 50, which is different from the case of winding the wire member formed using the superconductor around the base member 50. Accordingly, a load such as bending stress does not act on the superconductor thin film T formed on the outer circumferential face 50a of the base member 50, for example, even in a case in which the curvature of the winding portion 53 increases as the superconducting coil 5 is reduced in size or in the case of using the high-temperature superconductor which is relatively fragile as the material of the winding portion 53. Accordingly, the distortion as in the case of winding the wire member is not generated in the winding portion 53, the damage of the winding portion 53 is prevented, and the deterioration of the superconducting property of the winding portion 53 can be prevented.

Further, the winding portion 53 of the superconducting coil 5 includes the first winding portion 51 and the second winding portion 52, formed in the double helical shape to be parallel to each other, and the terminating end portion 51b of the first winding portion 51 and the starting end portion 52a of the second winding portion 52, which are adjacent to each other are connected to each other. Accordingly, when the current C flows to the winding portion 53 via the lead wire 8 connected to the starting end portion 51a of the first winding portion 51 and the terminating end portion 52b of the second winding portion 52, the superconducting coil 5 serves as the non-inductive superconducting coil 5 which acts such that the magnetic field generated in the first winding portion 51 is canceled out by the magnetic field generated in the second winding portion 52. In the non-inductive superconducting coil 5, the curvature of the winding portion 53 increases at the folded portion of the winding portion 53, that is, the connection portion 53C between the terminating end portion 51b of the first winding portion 51 and the starting end portion 52a of the second winding portion 52.

However, the winding portion 53 of the superconducting coil 5 of the present embodiment is formed using the superconductor thin film T formed on the outer circumferential face 50a of the base member 50. Thus, it is possible to provide the folded portion in the winding portion 53 by performing a patterning process of the superconductor thin film T, and it is unnecessary to cause the bending stress to act on the winding portion 53, which is different from the case of providing the folded portion by performing the bending process on the winding portion formed using the wire member. Accordingly, even when the high-temperature superconductor which is relatively fragile is used as the material of the winding portion 53, the distortion as in the case of winding the wire member is not generated in the superconductor thin film T formed on the outer circumferential face 50a of the base member 50, the damage of the winding portion 53 formed using the superconductor thin film T is prevented, and it is possible to prevent the deterioration of the superconducting property of the winding portion 53.

Accordingly, it is possible to prevent the generation of distortion in the winding portion 53, to prevent the deterioration of the superconducting property of the winding portion 53, and to suppress the decrease of the critical current or the critical magnetic field according to the persistent current switch 4 and the superconducting coil 5 of the present embodiment. Accordingly, it is possible to realize the high-performance persistent current switch 4. In addition, it is possible to use the high-temperature superconducting material which is relatively fragile for the superconducting coil 1 for outputting a magnetic field of the persistent current circuit and the superconducting coil 5 for switch and the superconducting coil 6 for control of the persistent current switch 4, and it is possible to continuously output a stabilized magnetic field from the superconducting coil 1 for outputting a magnetic field.

In addition, it is possible to easily form the winding portion 53 forming the non-inductive superconducting coil 5 since the winding portion 53 includes the first winding portion 51 and the second winding portion 52, formed in the double helical shape to be parallel to each other, and the terminating end portion 51b of the first winding portion 51 and the starting end portion 52a of the second winding portion 52, which are adjacent to each other are connected to each other.

Second Embodiment

Hereinafter, a description will be given regarding a second embodiment of the persistent current switch and the superconducting coil of the present invention by incorporating FIGS. 1 to 4 with reference to FIGS. 6A and 6B.

Figure 6A:
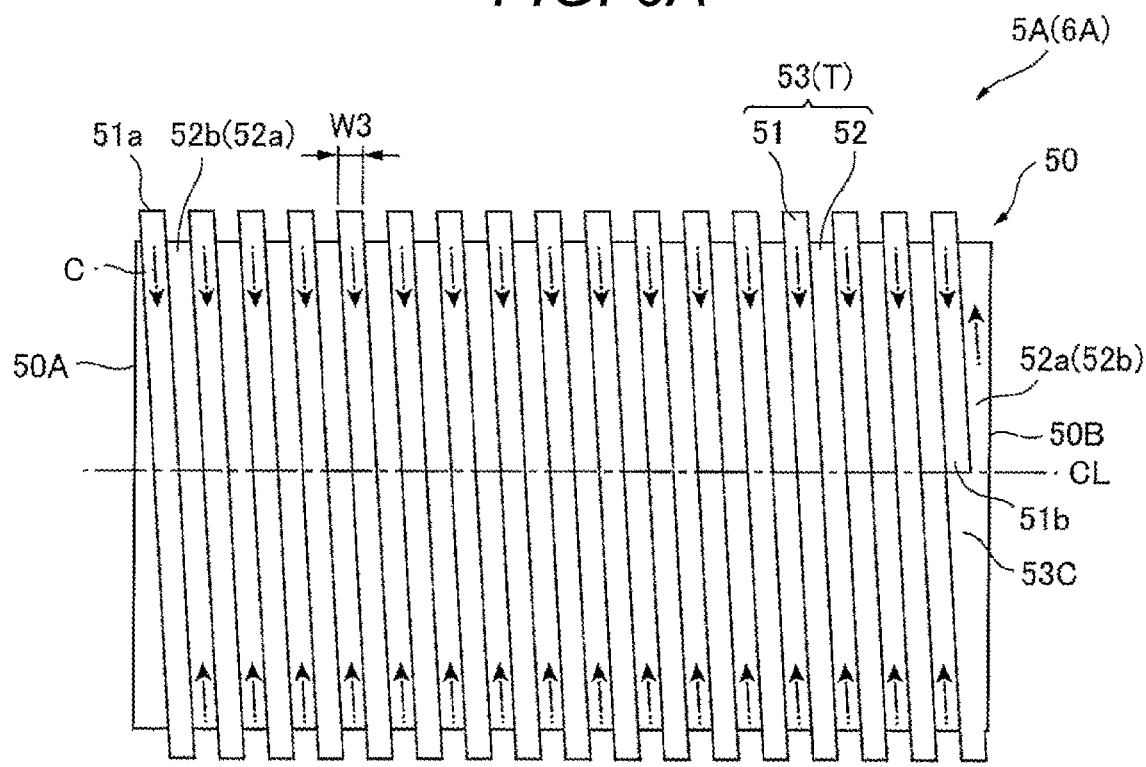
FIG. 6A is a schematic front view of a superconducting coil according to a second embodiment of the present invention.
Figure 6B:
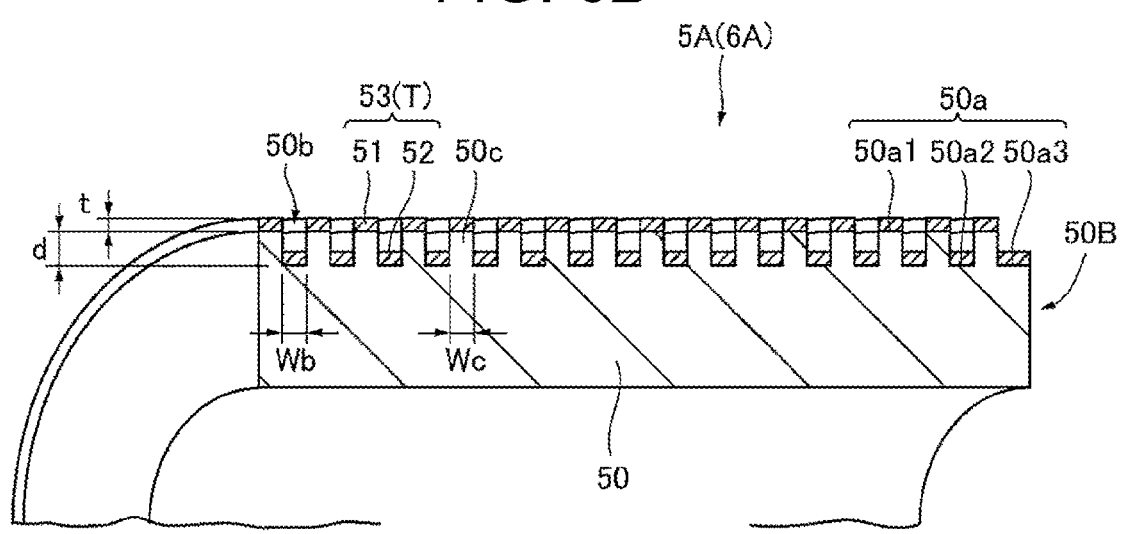
FIG. 6B is a schematic cross-sectional view illustrating a cross-sectional structure of the superconducting coil illustrated in FIG. 6A.

FIG. 6A is a schematic front view of a superconducting coil 5A according to the second embodiment of the present invention. FIG. 6B is a schematic cross-sectional view illustrating a cross-sectional structure of apart of the superconducting coil which is obtained by cutting the superconducting coil illustrated in FIG. 6A along a plane perpendicular to the paper plane along a central axis CL and a plane parallel to the paper plane along the central axis.

A persistent current switch and the superconducting coil 5A of the present embodiment are different from the persistent current switch 4 and the superconducting coil 5 described in the above-described first embodiment in terms that a helical groove 50b is formed in the outer circumferential face 50a of the base member 50 in which the winding portion 53 of the superconducting coil 5A is formed. Other points of the persistent current switch and the superconducting coil 5A of the present embodiment are the same as the persistent current switch 4 and the superconducting coil 5 of the first embodiment, and thus, the same parts will be denoted by the same reference signs and the description thereof will be appropriately omitted.

In the present embodiment, the base member 50 includes the helical groove 50b on the outer circumferential face 50a. Accordingly, the outer circumferential face 50a of the base member 50 includes an outside outer circumferential face 50a1 outside the groove 50b and an inside outer circumferential face 50a2 inside the groove 50b. That is, the outside outer circumferential face 50a1 is a top face of a convex portion 50c remaining between the groove 50b and the groove 50b, and the inside outer circumferential face 50a2 is a bottom surface of the groove 50b. The groove 50b of the present embodiment is formed to have a rectangular cross-sectional shape in the cross section illustrated in FIG. 6B. A method of forming the groove 50b in the base member 50 is not particularly limited, and examples thereof can include a chemical method such as etching, a method of using laser, a mechanical method such as cutting, and the like.

In addition, the superconducting coil 5A of the present embodiment is non-inductive similarly to the superconducting coil 5 of the first embodiment, and the winding portion 53 includes the first winding portion 51 and the second winding portion 52 which are formed in a double helical shape to be parallel to each other. The first winding portion 51 is formed on the outside outer circumferential face 50a1 of the base member 50, and the second winding portion 52 is formed on the inside outer circumferential face 50a2 of the base member 50. The terminating end portion 51b of the first winding portion 51 and the starting end portion 52a of the second winding portion 52 are connected via a connection face 50a3 which is smoothly continuous to the outside outer circumferential face 50a1 and the inside outer circumferential face 50a2.

That is, a height of the convex portion 50c is set to gradually decrease by changing a stepped shape between the outside outer circumferential face 50a1 and the inside outer circumferential face 50a2 such that the outside outer circumferential face 50a1 outside the groove 50b and the inside outer circumferential face 50a2 inside the groove 50b are connected at one end portion 50B of the cylindrical base member 50. Accordingly, the first winding portion 51 and the second winding portion 52 are connected via the connection portion 53C, thereby obtaining the winding portion 53 folded at the connection portion 53C.

A depth d of the groove 50b is preferably set to be sufficiently deep as compared to a thickness t of the winding portion 53 from a viewpoint of preventing connection between the first winding portion 51 and the second winding portion 52 at a location other than the connection portion 53C in the connection face 50a3. For example, when the width W3 of the winding portion 53 is about several mm, and the thickness t of the winding portion 53 is about several tens of μm to several hundreds of μ, the depth d of the groove 50b can be set to about several hundreds of μm to several mm.

To be more specific, the depth of the groove 50b can be set to be about ten times the thickness t of the winding portion 53 or ten times or more thereof. For example, when the thickness t of the winding portion 53 is 10 μm, the depth of the groove 50b can be set to be 100 μm or more. Incidentally, the depth d of the groove 50b is not limited to have the above-described relationship of being ten times or more of the thickness of the winding portion 53, may be less than ten times thereof as long as having a relationship that can prevent a short circuit between the first winding portion 51 formed on the outside outer circumferential face 50a1 of the base member 50 and the second winding portion 52 on the inside outer circumferential face 50a2.

In addition, a width Wb of the groove 50b is preferably equivalent to or the same as a width Wc of the convex portion 50c remaining between the grooves 50b in a cross section of the superconducting coil 5A along the central axis CL of the cylindrical base member 50, that is, a cross-section along the width Wb direction of the groove 50b in the persistent current switch and the superconducting coil 5A of the present embodiment from a viewpoint of reliably forming the second winding portion 52 by forming a superconductor thin film T in an inside inner circumferential face 50a2 inside the groove 50b. In other words, the width Wc of the outside outer circumferential face 50a1 and the width Wb of the inside outer circumferential face 50a2 are preferably equivalent to or the same as each other in the cross-section along the central axis CL of the cylindrical base member 50, that is, the cross section of the groove 50b in the width Wb direction.

Hereinafter, a description will be given regarding action of the persistent current switch and the superconducting coil 5A of the present embodiment. In the persistent current switch and the superconducting coil 5A of the present embodiment, the outer circumferential face 50a of the base member 50 includes the outside outer circumferential face 50a1 outside the groove 50b and the inside outer circumferential face 50a2 inside the groove 50b as the helical groove 50b is formed in the outer circumferential face 50a of the base member 50 in which the winding portion 53 is formed. Accordingly, a state in which an inside wall of the groove 50b between the outside outer circumferential face 50a1 and the inside outer circumferential face 50a2 is steeply erected with respect to these outer circumferential faces thereof, and is vertical or substantially vertical to these outer circumferential faces in the present embodiment, and a step is formed between the outside outer circumferential face 50a1 and the inside outer circumferential face 50a2.

Thus, a throwing performance of the superconductor thin film T with respect to the inside wall of the groove 50b is degraded when the superconductor thin film T is formed in the outer circumferential face 50a of the base member 50 similarly to the above-described first embodiment. That is, the superconductor thin film T is almost not formed on the inside wall of the groove 50b between the outside outer circumferential face 50a1 and the inside outer circumferential face 50a2, and the first winding portion 51 and the second winding portion 52, formed using the superconductor thin film T, is formed on each of the outside outer circumferential face 50a1 and the inside outer circumferential face 50a2.

Accordingly, the first winding portion 51 and the second winding portion 52 of the winding portion 53 are formed in an automatic and self-aligned manner in the thin film forming step of forming the superconductor thin film T on the outer circumferential face 50a of the base member 50. Accordingly, it is possible to omit the winding portion forming step of processing the superconductor thin film T formed in the outer circumferential face 50a of the base member 50 into the helical winding portion 53 according to the persistent current switch and the superconducting coil 5A of the present embodiment.

In addition, the terminating end portion 51b of the first winding portion 51 formed on the outside outer circumferential face 50a1 and the starting end portion 52a of the second winding portion 52 formed on the inside outer circumferential face 50a2 are connected via the connection face 50a3 which is smoothly continuous to the outside outer circumferential face 50a1 and the inside outer circumferential face 50a2. Accordingly, the connection portion 53C between the first winding portion 51 and the second winding portion 52 is formed in an automatic and self-aligned manner in the thin film forming step of forming the superconductor thin film T on the outer circumferential face 50a of the base member 50. Accordingly, it is possible to omit a step of forming the connection portion 53C between the first winding portion 51 and the second winding portion 52 in the superconductor thin film T according to the persistent current switch and the superconducting coil 5A of the present embodiment.

Incidentally, it is possible to consider a state in which a trace of the superconductor adheres to the inside wall of the groove 50b of the base member 50 depending on a film formation condition. However, a cross-sectional area of the superconductor thin film T adhering to the inside wall of the groove 50b is extremely small as compared to a cross-sectional area of the winding portion 53. Thus, the superconductor thin film T adhering to the inside wall of the groove 50b is turned into the normal conducting state according to the current C exceeding the critical current, and exhibits an extremely high electrical resistance even in a state in which the winding portion 53 of the superconducting coil 5A maintains the superconducting state. Accordingly, the current C flows only to the first winding portion 51 and the second winding portion 52, which are in the superconducting state, in superconducting state of the winding portion 53, and does not flow to the superconductor thin film T which adheres to the inside wall of the groove 50b and is in the normal conducting state.

As described above, it is possible not only to obtain the same effect as in the persistent current switch 4 and the superconducting coil 5 of the first embodiment but also to improve productivity by omitting the winding portion forming step according to the persistent current switch and the superconducting coil 5A of the present embodiment.

Incidentally, the description has been given in the present embodiment regarding the non-inductive superconducting coil 5A which includes the non-inductive winding portion 53 in which the terminating end portion of the first winding portion 51 and the starting end portion 52a of the second winding portion 52 are connected to each other. However, it is also possible to manufacture a superconducting coil 6A having a double helix structure that is not a non-inductive type in which the first winding portion 51 and the second winding portion 52 of the winding portion 53 are connected in parallel by connecting the starting end portion 51a of the first winding portion 51 and the starting end portion 52a of the second winding portion 52 and connecting the terminating end portion 51b of the first winding portion 51 and the terminating end portion 52b of the second winding portion 52 by reversing the starting end portion 52a of the second winding portion 52 and the terminating end portion 52b. When the first winding portion 51 and the second winding portion are connected in parallel, it is possible to double a superconducting current that can be caused to flow to the winding portion 53 and obtain the superconducting coil 6A for control which is capable of generating a higher magnetic field.

In addition, the description has been given in the present embodiment regarding the case in which the cross-sectional shape of the groove 50b is the rectangular shape, and the width Wc of the outside outer circumferential face 50a1 and the width Wb of the inside outer circumferential face 50a2 are equivalent or equal to each other in the cross section in the direction along the central axis CL of the base member 50, that is, the cross section along the width Wb direction of the groove 50b, the cross-sectional shape of the groove 50b is not limited thereto. Hereinafter, modified examples of the cross-sectional shape of the groove 50b will be described.

Figure 7A:
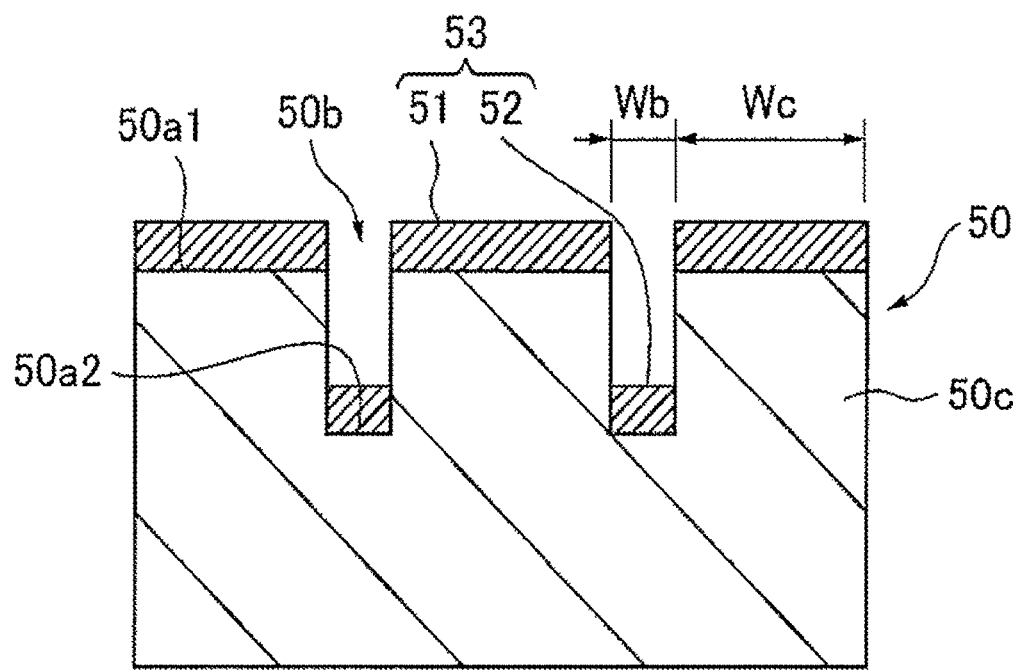
FIG. 7A is a schematic cross-sectional view illustrating a modified example of a groove illustrated in FIG. 6B.

FIGS. 7A to 7D are schematic enlarged cross-sectional views illustrating modified examples of the cross-sectional shape of the groove 50b. When the cross-sectional shape of the groove 50b along the width direction is a rectangle as illustrated in FIG. 7A, the width Wb of the groove 50b and the width Wc of the convex portion 50c between the grooves 50b, that is, the width Wc of the outside outer circumferential face 50a1 and the width Wb of the inside outer circumferential face 50a2 may be set to be different. In this case, it is possible to determine the width Wc of the outside outer circumferential face 50a1 and the width Wb of the inside outer circumferential face 50a2 such that the magnetic field generated in the first winding portion 51 and the magnetic field generated in the second winding portion 52 are canceled with each other as much as possible.

Figure 7B:
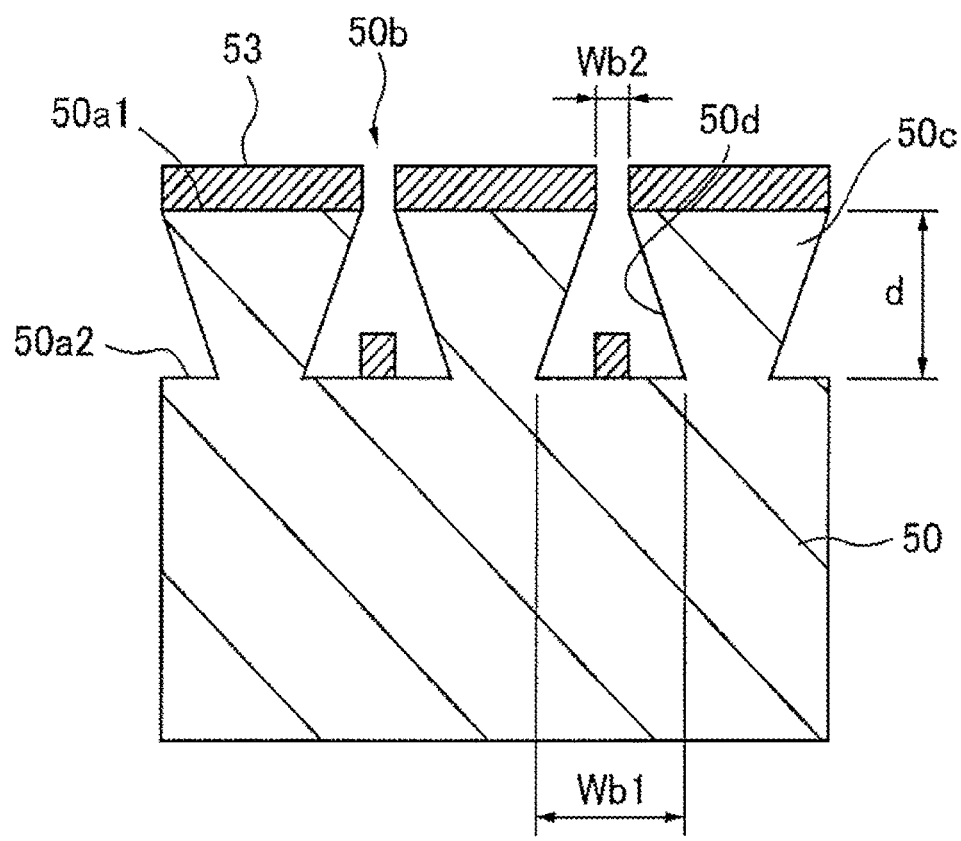
FIG. 7B is a schematic cross-sectional view illustrating a modified example of the groove illustrated in FIG. 6B.
Figure 7C:
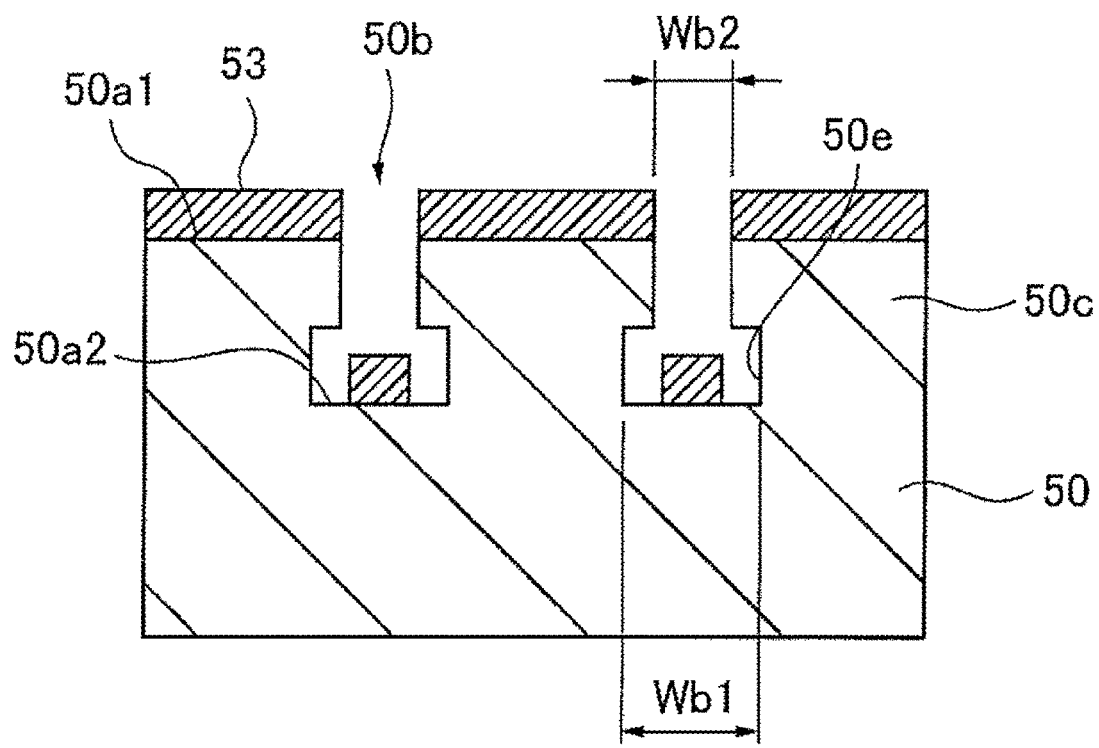
FIG. 7C is a schematic cross-sectional view illustrating a modified example of the groove illustrated in FIG. 6B.

In addition, the groove 50b may have an inclined face 50d, which is inclined with respect to the depth d direction in a cross section along directions of widths Wb1 and Wb2, and the width Wb1 of a bottom portion may be enlarged more than the width Wb2 of an opening portion as illustrated in FIG. 7B. In addition, the groove 50b may have a rectangular undercut portion 50e in a cross section along directions of widths Wb1 and Wb2, and the width Wb1 of the bottom portion may be enlarged more than the width Wb2 of the opening portion as illustrated in FIG. 7C. Accordingly, it is possible to decrease the superconductor adhering to the inclined face 50d or the undercut portion 50e of the groove 50b.

Figure 7D:
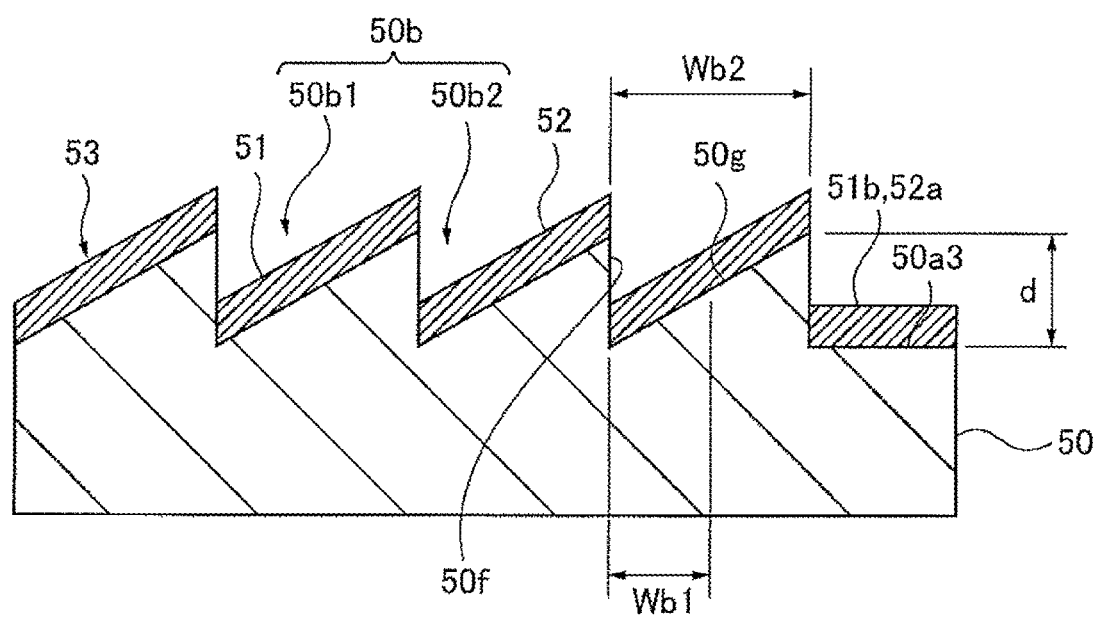
FIG. 7D is a schematic cross-sectional view illustrating a modified example of the groove illustrated in FIG. 6B.

In addition, the groove 50b may have a vertical wall face 50f along the depth d direction in a cross section along the width Wb direction and an inclined face 50g, which is inclined with respect to the depth d direction, and the width Wb2 of the opening portion may be enlarged more than the width Wb1 of the bottom portion as illustrated in FIG. 7D. In this case, the winding portion 53 may be set as the typical single helical winding portion 53 which is not a non-inductive type, but can be set as the non-inductive winding portion 53 as follows.

That is, the groove 50b includes a first groove 50b1 and a second groove 50b2 which are formed in a double helical shape to be parallel to each other. The winding portion 53 includes a first winding portion 51 and a second winding portion 52 which are formed in a double helical shape to be parallel to each other. The first winding portion 51 is formed on the inclined face 50g of the first groove 51b1, and the second winding portion 52 is formed on the inclined face 50g of the second groove 50b2. Further, the base member 50 includes the connection face 50a3 between the inclined face 50g of the first groove 50b1 and the inclined face 50g of the second groove 50b2, and the terminating end portion 51b of the first winding portion 51 and the starting end portion 52a of the second winding portion 52 are connected via the connection face 50a3.

Even when the groove 50b having each cross-sectional shape illustrated in FIGS. 7A to 7D is formed in the base member 50 as above, it is possible to obtain the same effect as in the persistent current switch and the superconducting coil 5A of the present embodiment described above.

Third Embodiment

Hereinafter, a description will be given regarding a third embodiment of the persistent current switch and the superconducting coil of the present invention by incorporating FIGS. 1 to 4 with reference to FIGS. 8A and 8B.

Figure 8A:
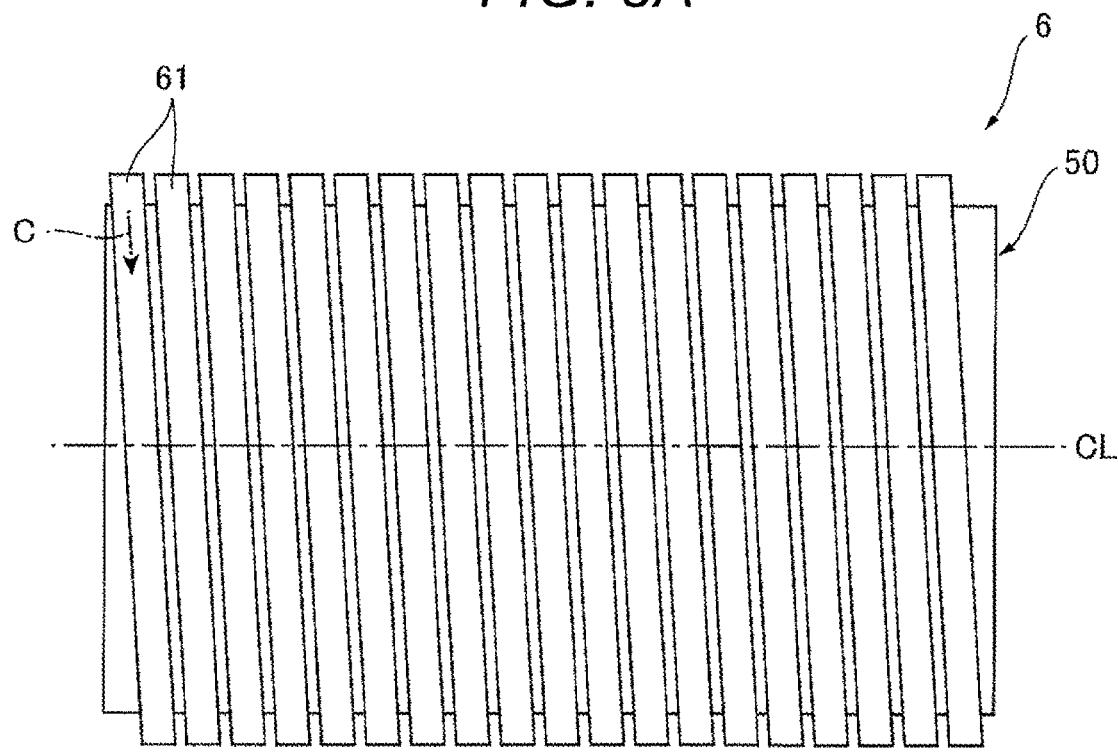
FIG. 8A is a schematic front view of a superconducting coil according to a third embodiment of the present invention.
Figure 8B:
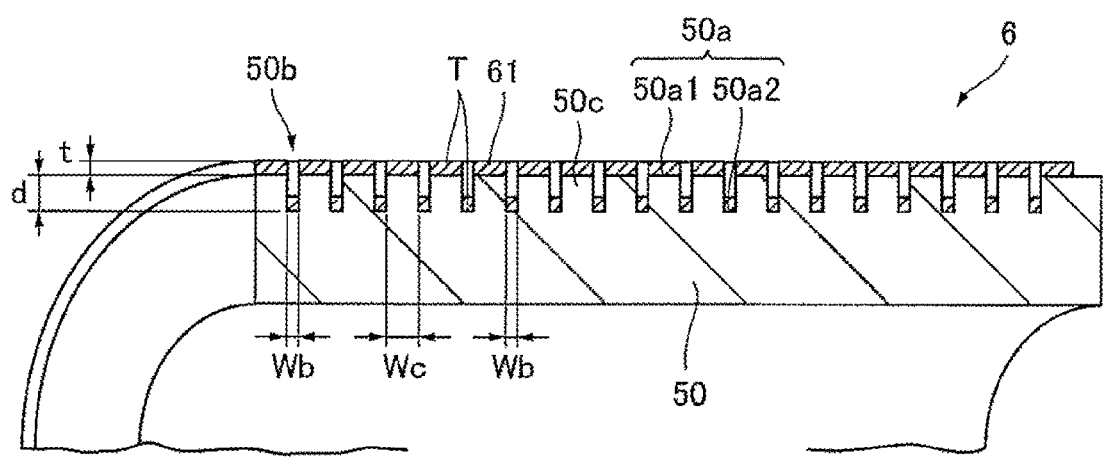
FIG. 8B is a schematic cross-sectional view illustrating a cross-sectional structure of the superconducting coil illustrated in FIG. 8A.

FIG. 8A is a schematic front view of a superconducting coil 6 according to the third embodiment of the present invention. FIG. 8B is a schematic cross-sectional view illustrating a cross-sectional structure of a part of the superconducting coil 6 which is obtained by cutting the superconducting coil 6 illustrated in FIG. 8A along a plane perpendicular to the paper plane along a central axis CL and a plane parallel to the paper plane along central axis CL.

A persistent current switch and the superconducting coil 6 of the present embodiment are different from the persistent current switch and the superconducting coil 5A described in the above-described second embodiment in terms that the superconducting coil 6 is the typical superconducting coil 6 which is not a non-inductive type. The superconducting coil 6 of the present embodiment can be used as the superconducting coil 6 for control, for example. Other points of the persistent current switch and the superconducting coil 6 of the present embodiment are the same as the persistent current switch and the superconducting coil 5A of the second embodiment, and thus, the same parts will be denoted by the same reference signs and the description thereof will be appropriately omitted.

The superconducting coil 6 of the present embodiment includes the winding portion 61 which is formed using the superconductor thin film T formed on the outer circumferential face 50a of the cylindrical base member 50 that includes the helical groove 50b similarly to the superconducting coil 5A of the second embodiment. In addition, the outer circumferential face 50a of the base member 50 includes the outside outer circumferential face 50a1 outside the groove 50b and the inside outer circumferential face 50a2 inside the groove 50b. The superconducting coil 6 of the present embodiment uses only the superconductor thin film T formed on the outside outer circumferential face 50a1 as the winding portion 61, and does not use the superconductor thin film T formed on the inside outer circumferential face 50a2. That is, the winding portion 61 of the superconducting coil 6 of the present embodiment is formed only on the outside outer circumferential face 50a1 and does not have a double helix structure.

Accordingly, the width Wb of the inside outer circumferential face 50a2 is set to be sufficiently smaller than the width Wc of the outside outer circumferential face 50a1 in the width Wb direction of the groove 50b along the central axis of the cylindrical base member 50. That is, the width Wb of the groove 50b formed in the outer circumferential face 50a of the base member 50 is set to be sufficiently narrower than a width of the convex portion 50c between the grooves 50b. To be more specific, it is desirable to set the width Wb of the groove 50b to be as narrow as possible in a range in which the superconductor thin film T formed on the outside outer circumferential face 50a1 is divided by the groove 50b. For example, when the thickness t of the winding portion 61 is about several tens of μm to several hundreds of μm, it is possible to set the width Wb of the groove 50b to be about 100 μm, and the depth d of the groove 50b to be about 200 μm.

According to the persistent current switch and the superconducting coil 6 of the present embodiment, it is possible to control the decrease of the critical current or the critical magnetic field and to improve performance of the persistent current switch 4, similarly to the non-inductive superconducting coils 5 and 5A of the first and second embodiments, in the superconducting coil 6 which is not the non-inductive type like the superconducting coil 6 for control illustrated in FIG. 2, for example.

Fourth Embodiment

Hereinafter, a description will be given regarding a fourth embodiment of the persistent current switch and the superconducting coil of the present invention by incorporating FIGS. 1 to 4 with reference to FIG. 9.

FIG. 9 is a schematic cross-sectional view illustrating a cross-sectional structure of a part of a superconducting coil 5B which is obtained by cutting the superconducting coil 5B along a plane perpendicular to the paper plane along a central axis of the base member 50 and a plane parallel to the paper plane along the central axis.

A persistent current switch and the superconducting coil 5B of the present embodiment are different from the superconducting coil 6 described in the above-described third embodiment in terms that the first winding portion 51 and the second winding portion 52, which form the winding portion 53 on the outer circumferential face 50a of the base member 50, are stacked with an insulating film 56 interposed therebetween. Other points of the superconducting coil 5B of the present embodiment are the same as the superconducting coil 6 of the third embodiment, and thus, the same parts will be denoted by the same reference signs and the description thereof will be appropriately omitted.

The superconducting coil 5B or 6A of the present embodiment is the non-inductive superconducting coil 5B for switch or the superconducting coil 6A for control which is not the non-inductive type, and the winding portion 53 includes the first winding portion 51 and the second winding portion 52 which are formed in a double helical shape to be parallel to each other. The base member 50 includes the helical groove 50b in the outer circumferential face 50a and includes the outside outer circumferential face 50a1 outside the groove 50b and the inside outer circumferential face 50a2 inside the groove 50b. The first winding portion 51 is formed on the outside outer circumferential face 50a1. The second winding portion 52 is stacked on the first winding portion 51 with the insulating film 56 interposed therebetween. In the present embodiment, the depth d of the groove 50b is set to be deeper than that of the groove 50b of the base member 50 of the superconducting coil 6 of the third embodiment illustrated in FIG. 8B by at least a thickness t1 of the insulating film 56 and the second winding portion 52.

In the case of the non-inductive superconducting coil 5B, the terminating end portion 51b of the first winding portion 51 and the starting end portion 52a of the second winding portion 52 are connected via a through-hole 56a, that is, a through-hole passing through the insulating film 56. In the case of the superconducting coil 6A which is not the non-inductive type, the starting end portion 51a of the first winding portion 51 and the starting end portion 52a of the second winding portion 52, and the terminating end portion 51b of the first winding portion 51 and the terminating end portion 52b of the second winding portion 52 are connected via the through-hole 56a passing through the insulating film 56.

When the superconducting coils 5B and 6A are manufactured, the superconductor thin film T is formed on the outer circumferential face 50a of the base member 50, and the first winding portion 51 is formed on the outside outer circumferential face 50a1 outside the groove 50b, similarly to the superconducting coil 6 of the third embodiment. Thereafter, the insulating film 56 is formed on the first winding portion 51 to be stacked on the first winding portion 51, and the through-hole 56a is formed in the insulating film 56.

The through-hole 56a of the insulating film 56 is formed at a position corresponding to the terminating end portion 51b of the first winding portion 51 in the case of manufacturing the non-inductive superconducting coil 5B. In addition, the through-hole 56a of the insulating film 56 is formed at positions corresponding to the starting end portion 51a and the terminating end portion 51b of the first winding portion 51 in the case of manufacturing the superconducting coil 6A which is not the non-inductive type. Next, the superconductor thin film T is formed on the insulating film 56. In the above-described manner, it is possible to manufacture the non-inductive superconducting coil 5B in which the first winding portion 51 and the second winding portion 52 are connected in series or the superconducting coil 6A which is not the non-inductive type in which the first winding portion 51 and the second winding portion 52 are connected in parallel.

According to the superconducting coils 5B and 6A and a persistent current switch using the same of the present embodiment, it is possible to obtain the same effect as that of the superconducting coils 5, 5A and 6 and the persistent current switch 4 using the same of the first to third embodiments. In addition, it is possible to double a superconducting current that can be caused to flow to the winding portion 53 and obtain the superconducting coil 6A for control which is capable of generating a higher magnetic field by connecting the first winding portion 51 and the second winding portion 52 in parallel. In this case, if it is possible to set the depth d of the groove 50b to be sufficiently deep, the winding portion 53 may be set as the winding portion 53 including three or more layers parallel to each other by stacking three or more layers of the superconductor thin film T with the insulating film 56 interposed therebetween without being limited to the two-parallel winding portion 53 including the two layers of the first winding portion 51 and the second winding portion 52.

Although the embodiment of the present invention has been described in detail with reference to the drawings as above, a specific configuration is not limited to the embodiment, and design alterations or the like made in a scope not departing from a gist of the present invention is included in the present invention. For example, the description has been given in the above-described embodiments regarding the magnetic field-type persistent current switch, the non-inductive superconducting coil of the present invention can be applied also to a thermal type persistent current switch.

REFERENCE SIGNS LIST 4 persistent current switch, 5, 5A, 5B superconducting coil (for switch), 6, 6A superconducting coil (for control), 50 base member, 50a outer circumferential face, 50a1 outside outer circumferential face, 50a2 inside outer circumferential face, 50a3 connection face, 50b groove, 50d inclined face, 50e undercut portion, 50f vertical wall face, 50g inclined face, 51 first winding portion, 51a starting end portion, 51b terminating end portion, 52 second winding portion, 52a starting end portion, 52b terminating end portion, 53 winding portion, 54 first groove, 55 second groove, 56 insulating film, 56a through-hole, 61 winding portion, d depth, T superconductor thin film, Wb width, Wb1 width of bottom portion, Wb2 width of opening portion

The invention claimed is:

1. A superconducting coil comprising a winding portion which is formed using a superconductor thin film formed on an outer circumferential face of a cylindrical base member including a helical groove, wherein
   the outer circumferential face includes an outside outer circumferential face outside the helical groove and an inside outer circumferential face inside the helical groove,
   the winding portion is formed on the outside outer circumferential face and includes a first winding portion and a second winding portion which are formed in a double helical shape to be parallel to each other,
   the first winding portion is formed on the outside outer circumferential face, and
   the second winding portion is stacked on the first winding portion with an insulating film interposed therebetween.

2. The superconducting coil according to claim 1, wherein the second winding portion is formed on the inside outer circumferential face.

3. The superconducting coil according to claim 2, wherein a terminating end portion of the first winding portion and a starting end portion of the second winding portion are connected to each other.

4. The superconducting coil according to claim 2, wherein a starting end portion of the first winding portion and the starting end portion of the second winding portion are connected to each other, and
a terminating end portion of the first winding portion and a terminating end portion of the second winding portion are connected to each other.

5. The superconducting coil according to claim 1, wherein the helical groove has a rectangular cross-sectional shape along a width direction.

6. The superconducting coil according to claim 1, wherein the helical groove includes an inclined face inclined with respect to a depth direction in a cross section along a width direction, in which a width of a bottom portion is enlarged more than a width of an opening portion.

7. The superconducting coil according to claim 1, wherein the helical groove includes a rectangular undercut portion in a cross section along a width direction, in which a width of a bottom portion is enlarged more than a width of an opening portion.

8. The superconducting coil according to claim 1, wherein the helical groove includes a vertical wall face along a depth direction in a cross section along a width direction and an inclined face inclined with respect to the depth direction, in which a width of an opening portion is enlarged more than a width of a bottom portion.

9. The superconducting coil according to claim 8, wherein the helical groove includes a first groove and a second groove which are formed in a double helical shape to be parallel to each other, the first winding portion is formed on the inclined face of the first groove, the second winding portion is formed on the inclined face of the second groove, and the base member includes a connection face between the inclined face of the first groove and the inclined face of the second groove, and a terminating end portion of the first winding portion and a starting end portion of the second winding portion are connected via the connection face.

\* \* \* \* \*